United States Patent [19]

Bratro et al.

[11] Patent Number: 4,755,150
[45] Date of Patent: Jul. 5, 1988

[54] MEMORY CARTRIDGE SECURITY LOCKING DEVICE

[75] Inventors: Frederick E. Bratro, Manville; Thomas A. Kachnowski, Flemington; Elhanan Kaplan, East Brunswick; George A. Sudol, Kenvil, all of N.J.

[73] Assignee: Unisys Corporation, Blue Bell, Pa.

[21] Appl. No.: 58,716

[22] Filed: Jun. 5, 1987

[51] Int. Cl.⁴ .......................................... H01R 13/639
[52] U.S. Cl. ..................................... 439/304; 439/133
[58] Field of Search ................ 439/296, 304, 345, 133

[56] References Cited

U.S. PATENT DOCUMENTS

| | | | |
|---|---|---|---|
| 3,183,470 | 5/1965 | Hale | 439/304 |
| 3,662,320 | 5/1972 | Marx | 439/304 |
| 4,448,469 | 5/1984 | Metzger | 439/304 |
| 4,479,688 | 10/1984 | Jennings | 439/304 |
| 4,648,737 | 3/1987 | Lake, Jr. et al. | 439/304 |
| 4,659,159 | 4/1987 | Takahashi | 439/345 |

Primary Examiner—John McQuade
Attorney, Agent, or Firm—Albert B. Cooper; Laurence J. Marhoefer

[57] ABSTRACT

The locking apparatus is used to secure one or more memory cartridges in a housing in a computer system module. An L-shaped member is fastened to the module by a screw in an existing threaded screw hole in the module. A second member is inserted into the module and locked to the L-shaped member by a padlock. The second member includes a first plate that fits into a clearance space between the cartridges and the housing to prevent the cartridges from being unplugged from connectors mounted in the housing. The second member includes a second plate that prevents the end of the outermost cartridge from being pulled out of the housing to clear the first plate and includes a third plate which in use covers the mounting screw of the L-shaped member so that the screw cannot be removed.

3 Claims, 3 Drawing Sheets

MEMORY CARTRIDGE SECURITY LOCKING DEVICE

BACKGROUND OF THE INVENTION

1. Field of the Invention

The invention relates to computer systems with memory expandable by pluggable memory cartridges. The invention is particularly concerned with security locking devices for the cartridges.

2. Description of the Prior Art

Present day computer systems are often configured with random access memory (RAM) expandable via memory cartridges that may be plugged into the system. This arrangement is particularly useful in such present day computer systems as office work stations, personal computers, and minicomputers that may be comprised of modular units which are coupled together to form the system. For example, a CPU module, disk drive modules, and communication modules may be coupled together to form a system. The CPU module may include a recessed housing with plug connectors into which RAM cartridges may be inserted so that the purchaser of the system may select the memory requirements desired.

In such systems the cartridges, which tend to be expensive, are readily installed in and readily removed from the system. Accordingly cartridges installed in an assembled computer system may be unplugged and removed to another location on a temporary or permanent basis. For the user who desires to maintain the memory of the system in the configuration in which it was assembled, the removal of portions thereof may result in considerable expense and inconvenience. Accordingly a security locking mechanism which would hinder removal of memory cartridges from a computer system is desirable. It is furthermore desirable that the security mechanism be simple and inexpensive and be installable without undesirable machining such as drilling and tapping holes.

SUMMARY OF THE INVENTION

The present invention provides apparatus for locking a memory cartridge into a recessed housing in an assembly which may, for example, comprise a CPU module in a computer system. The housing includes a first electrical connector mounted on a first end wall thereof and a second end wall opposite the first end wall. A third wall of the housing extends between the first and second end walls with a narrow clearance between the third wall and the second end wall. The assembly includes a threaded screw hole outside the housing and proximate the third wall. The cartridge includes a second electrical connector mounted on a first end thereof which mates with the first electrical connector. The cartridge includes a second end opposite the first end and is installed in the housing by placing the cartridge in the housing with the second electrical connector adjacent the first electrical connector and the second end of the cartridge adjacent the second end wall of the housing. The cartridge is moved toward the first electrical connector until the connectors mate with respect to each other. A clearance space is thereby formed between the second end of the cartridge and the second end wall of the housing.

The locking apparatus comprises an L-shaped member having a first plate with a screw clearance hole therethrough and a second plate orthogonal to the first plate, the second plate having a first hole therethrough adapted to receive the shackle of a padlock.

The apparatus further includes a second member having:

(1) a third plate with a second hole therethrough adapted to receive the shackle of the padlock,
(2) a fourth plate opposite the third plate adapted to fit into the clearance space,
(3) a fifth plate orthogonal to the third plate positioned in use to cover the screw clearance hole,
(4) a sixth plate orthogonal to the fourth plate positioned in use to prevent pulling the second end of the cartridge out of the housing beyond the fourth plate, and
(5) a seventh plate to which the third through sixth plates are secured.

The L-shaped member is secured, in use, to the assembly by a screw passing through the screw clearance hole and secured in the threaded screw hole of the assembly. The second member is secured, in use, by the shackle of the padlock locked through the first and second holes and (1) with the third plate superposed with respect to the second plate with the first and second holes aligned,
(2) with the fifth plate covering the screw,
(3) with the fourth plate positioned in the clearance space, and
(4) with the sixth plate over a corner of the cartridge.

Therefore, the cartridge is prevented, by the fourth plate, from being moved out of the first electrical connector toward the second end wall of the housing and the corner of the cartridge is prevented, by the sixth plate, from being pulled outwardly so that the second end of the cartridge clears the fourth plate. The cartridge is accordingly secured in the housing.

Preferably an eighth plate is included with the second member, orthogonal to the sixth plate, abutting, in use, the third wall of the housing. The eighth plate, in combination with the fifth plate and the third wall of the housing, prevents rotation of the second member out of the housing about the shackle of the padlock. Such motion is prevented, in part, by the fifth plate contacting a part of the assembly. Preferably the third wall is bent to provide this motion stop.

DESCRIPTION OF THE PREFERRED EMBODIMENT

Figure 1:
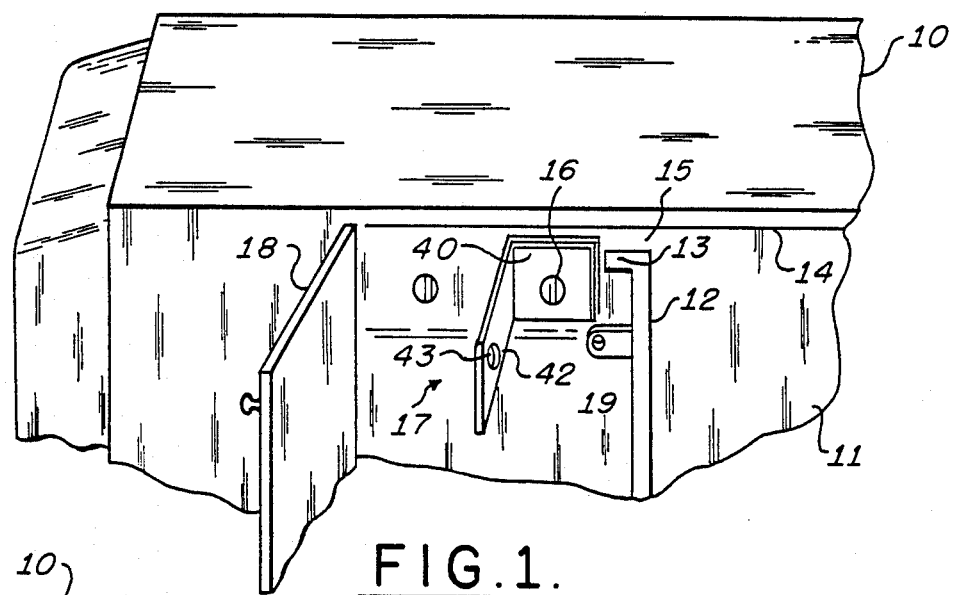
FIG. 1 is a perspective view of a portion of a CPU module with the L-shaped member of the locking apparatus installed.

Refer now to the figures. In FIG. 1 a portion of a CPU module assembly 10 is illustrated. The CPU module 10 may be of the type described in U.S. Pat. No.

4,648,737, issued Mar. 10, 1987 entitled "Theft Prevention Apparatus". The module 10 includes a housing 11 in which memory cartridges, such as RAM cartridges, may be installed to expand the memory capacity of the CPU. The housing 11 is bounded by a wall 12 having a portion 13 that bends away from the housing 11. The housing 11 is also bounded by an end wall 14 such that a clearance 15 is provided between the walls 12 and 14. The CPU module assembly 10 includes a screw 16 in a threaded screw hole in the assembly. For reasons to be described in detail hereinafter, an L-shaped member 17, part of the locking apparatus of the present invention, is secured to the assembly 10 by the screw 16. The CPU module assembly 10 includes a door 18, that closes to meet the wall 12 and is secured in a stop 19 by a snap latch (not shown). The member 17 is contained within the module 10 behind the door 18 when the door 18 is closed.

Figure 2:
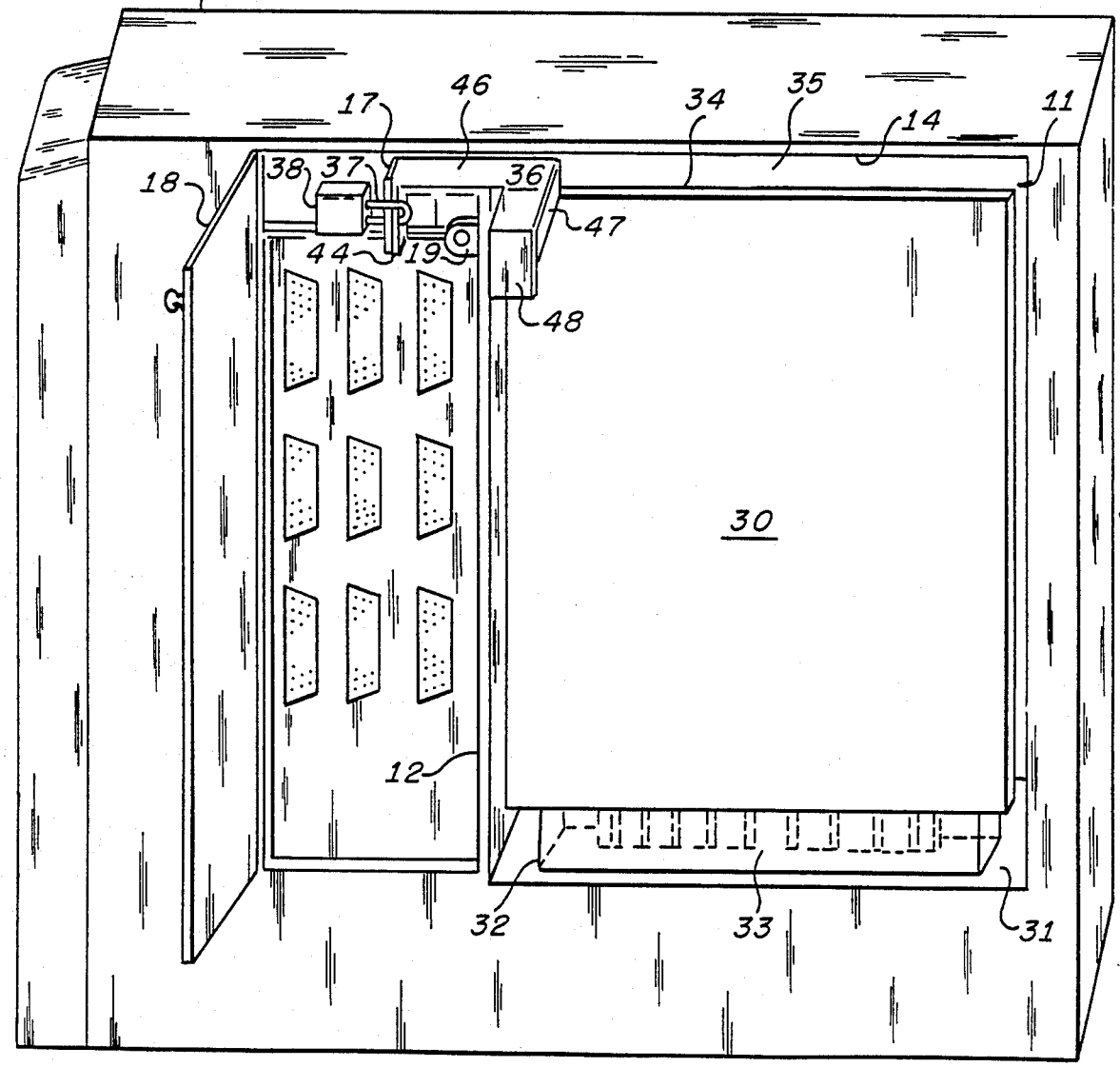
FIG. 2 is a perspective view of the CPU module with both members of the locking apparatus installed securing a member cartridge in a housing in the module.

FIG. 2, shows a perspective view of the CPU module assembly 10 with the locking apparatus of the present invention installed. Like reference numerals refer to like components in FIG. 1. As previously described, the L-shaped member 17 is secured to the assembly 10. A memory cartridge 30 is illustrated installed in the housing 11. The housing 11 has an end wall 31 opposite the end wall 14. An electrical connector 32 mounted on the end wall 31 mates with an electrical connector 33 mounted on one end of the memory cartridge 30. The other end 34 of the cartridge 30 is adjacent the end wall 14 of the housing 11 and forms clearance space 35 with respect thereto.

In a manner to be described in greater detail hereinafter a second member 36 of the locking apparatus of the present invention is secured to the member 17 by a shackle 37 of a padlock 38 to secure the member cartridge 30 in the housing 11.

Figure 3:
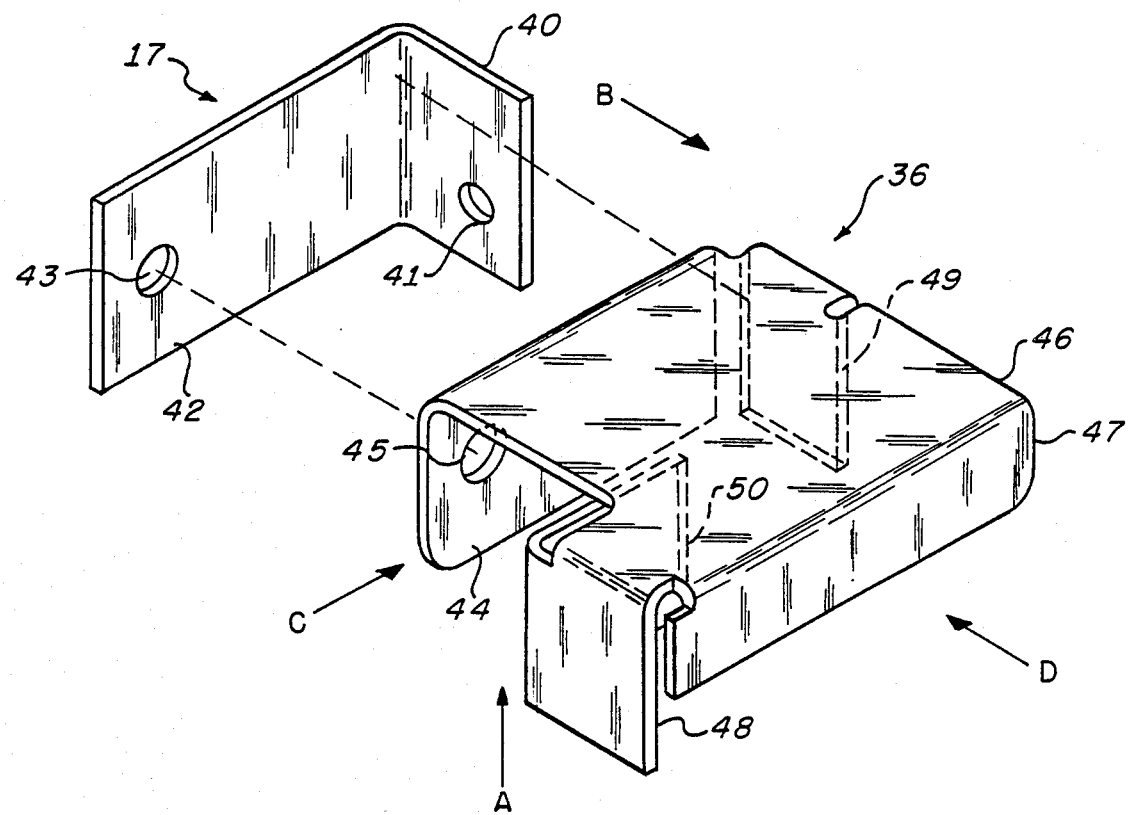
FIG. 3 is an isometric view of the two members of the locking apparatus of the present invention.

In FIG. 3 details of the members 17 and 36 are illustrated in isometric view. Like reference numerals indicate like components in FIGS. 1 and 2. The L-shaped member 17 includes a plate 40 with a screw clearance hole 41 therethrough. Orthogonal to the plate 40 is a plate 42 with a hole 43 therethrough adapted to receive the shackle 37 of the padlock 38. As described above with respect to FIG. 1, the member 17 is secured to the assembly 10 via the screw 16 through the hole 41 screwed into the existing threaded screw hole of the assembly 10.

The member 36 includes a plate 44 with a hole 45 therethrough. The plate 44 is orthogonal to a plate 46 and the hole 45 is adapted to receive the shackle 37 of the padlock 38. In use, the plate 44 is adjacent the plate 42 of the member 17 with the holes 43 and 45 aligned. The member 36 includes a plate 47 orthogonal to the plate 46 and opposite the plate 44. In use, the plate 47 is located in the clearance space 35 between the end 34 of the cartridge 30 and the end wall 14 of the housing 11 to prevent the cartridge 30 from being removed from the electrical connector 32.

The member 36 includes a plate 48 orthogonal to the plates 46 and 47. When the member 36 is locked in place, the plate 48 covers the upper left hand corner of the cartridge 30 preventing the top of the cartridge from being pulled out of the housing 11 to clear the plate 47 so as to forcibly remove the cartridge 30. The member 36 also includes a plate 49 (shown in phantom) orthogonal to the plates 46 and 44. When the member 36 is locked in place, the plate 49 covers the mounting screw 16 preventing the unscrewing thereof.

The member 36 also includes a plate 50 (shown in phantom) orthogonal to the plates 46 and 48. In use the plate 50 is adjacent the wall 12 on the right hand side thereof and, in combination with the wall 12 and the plate 49 prevents rotation of the member 36 out of the clearance space 35 about the shackle 37.

Figure 4A:
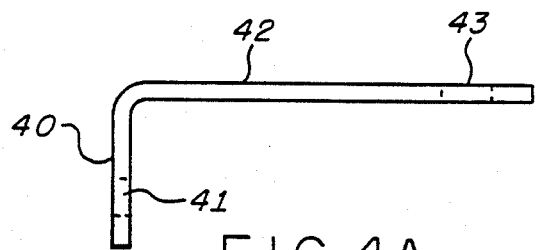
FIGS. 4A-4C are scale drawings showing three views, respectively, of the L-shaped member of the locking apparatus of the present invention.
Figure 4B:
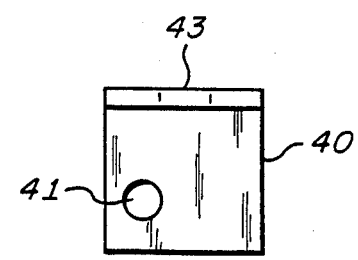
Figure 4C:
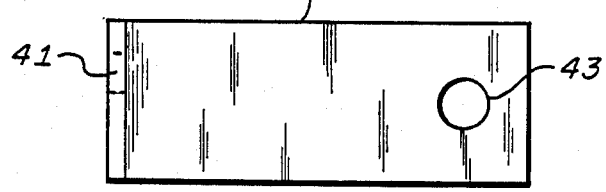
Figure 5D:
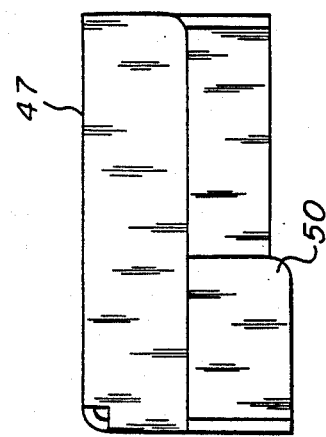
FIGS. 5A-5D are scale drawings showing four views, respectively, of the second member of the locking apparatus of the present invention.
Figure 5C:
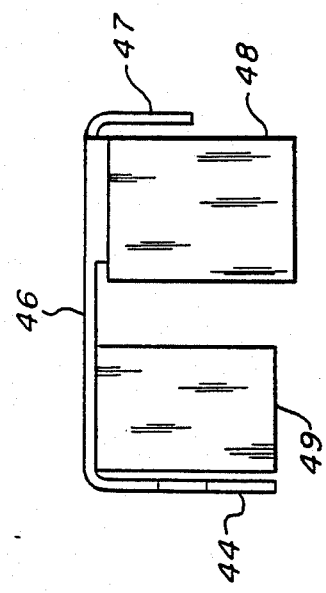
Figure 5A:
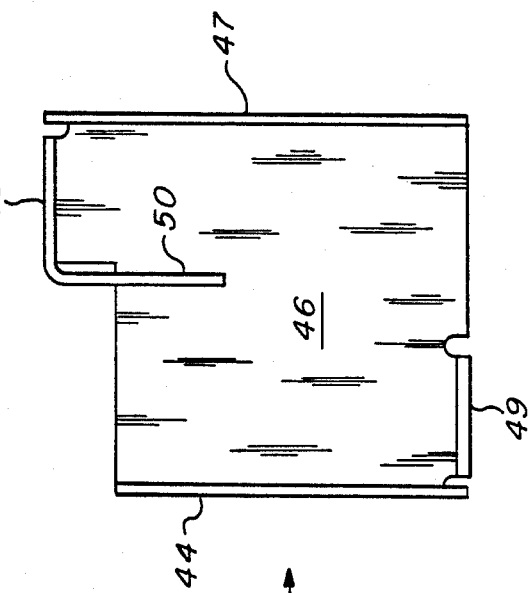
Figure 5B:
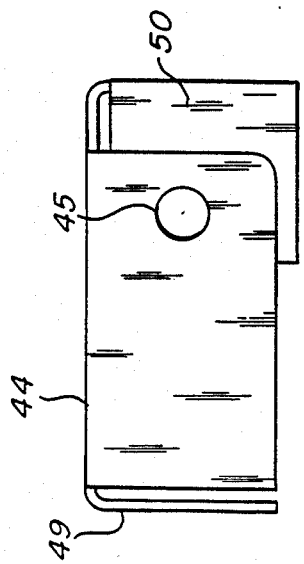

FIGS. 4A–4C and 5A–5D are scale drawings of various views of the members 17 and 36, respectively. FIGS. 4A–4C illustrate three views, respectively, of the member 17. FIGS. 5A–5D illustrate four views, respectively, of the member 36 where the views A,B, C and D correspond to the similarly designated viewing directions of FIG. 3. The reference numerals applied to the elements of FIGS. 4A–4C and 5A–5D correspond to the similarly designated elements of FIG. 3.

Referring to FIGS. 1, 2 and 3 in the use of the locking apparatus of the present invention, the member 17 is secured to the assembly 10 by the screw 16 via the screw clearance hole 41. Prior to installing the member 36, the memory cartridge 30 is placed in the housing 11 with the end 34 thereof adjacent the end wall 14 and with the electrical connector 33 adjacent the electrical connector 32 preparatory to being plugged therein. The cartridge 30 is then translated in the direction of the arrow until the connector 33 mates in the connector 32. It is appreciated that the housing 11 may contain plural memory cartridges having corresponding electrical connectors on the end wall 31. After all the cartridges are installed, the member 36 is inserted generally in the orientation illustrated in FIG. 3 with the plate 46 fitting into the clearance 15. When installed, the plate 44 is superposed with respect to the plate 42, to the right thereof with the holes 43 and 45 aligned. The plate 47 is thereby inserted into the clearance space 35 preventing the cartridge 30 from being unplugged from the connector 32. The plate 48 prevents the outermost cartridge from being removed from the housing 11 by pulling the second end of the cartridge outward to clear the plate 47 thereby permitting unplugging from the connector 32. When the member 36 is positioned as described, the plate 49 covers the mounting screw 16 preventing removal thereof. Additionally with the plate 49 positioned as described and with the plate 50 abutting and to the right of the wall 12, rotation of the member 36 about the shackle 37 out of the housing 11 is prevented. When such rotation is attempted, the plate 49 abuts the portion 13 of the wall 12 and, with the plate 50 abutting the opposite side of the wall 12, such rotation is prevented.

It is thus appreciated that with the shackle 37 of the padlock 38 locked through the aligned holes 43 and 45, the member 36 is secured in place thus preventing any of the memory cartridges 30 from being removed from the housing 11. With the members 17 and 36 locked in place by the padlock 38, the door 18 is closed with the lock 38 inside the unit.

Each of the members 17 and 36 may be stamped and formed from a unitary piece of metal. The apparatus of the present invention provides a simple and economical security lock for computer system memory cartridges such as RAM cartridges. The apparatus is adaptable to an existing screw hole on the assembly so that customers are not required to perform any machining in installing the device. A simple installation operation is utilized employing the existing screw or a longer screw to accommodate the thickness of the mounting plate 40.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. Apparatus for locking a memory cartridge into a recessed housing in an assembly, said housing having a first electrical connector mounted on a first end wall thereof, said housing having a second end wall opposite said first end wall and a third wall extending between said first and second end walls with a clearance between said third wall and said second end wall, said assembly having a threaded screw hole therein outside said housing and proximate said third wall, said cartridge having a second electrical connector mounted on a first end thereof and having a second end opposite said first end, said cartridge being installable in said housing by placing said cartridge in said housing with said second electrical connector adjacent said first electrical connector and said second end of said cartridge adjacent said second end wall and moving said cartridge toward said first electrical connector until said second electrical connector mates with said first electrical connector, a clearance space being formed thereby between said second end of said cartridge and said second end wall, said locking being effected by a padlock having a shackle, said apparatus comprising:

an L-shaped member having a first plate with a screw clearance hole therethrough and a second plate orthogonal to said first plate, said second plate having a first hole therethrough adapted to receive said shackle, and a second member having:
(1) a third plate with a second hole therethrough adapted to receive said shackle,
(2) a fourth plate opposite said third plate adapted to fit into said clearance space,
(3) a fifth plate orthogonal to said third plate positioned in use to cover said screw clearance hole,
(4) a sixth plate orthogonal to said fourth plate positioned in use to prevent pulling said second end of said cartridge out of said housing beyond said fourth plate, and
(5) a seventh plate to which said third plate, fourth plate, fifth plate, and sixth plate are secured, said L-shaped member being secured, in use, to said assembly by a screw passing through said screw clearance hole and secured in said threaded screw hole of said assembly, said second member being secured, in use by said shackle locked through said first and second holes and:
(1) with said third plate superposed with respect to said second plate with said first and second holes aligned,
(2) with said fifth plate covering said screw,
(3) with said fourth plate positioned in said clearance space, and
(4) with said sixth plate over a corner of said cartridge, so that said cartridge is prevented, by said fourth plate, from being moved out of said first electrical connector toward said second end wall of said housing and said second end thereof is prevented, by said sixth plate, from being pulled outwardly to clear said fourth plate, thereby securing said cartridge in said housing.

2. The apparatus of claim 1 in which said second member further includes an eighth plate secured to said seventh plate and orthogonal to said sixth plate, said eighth plate, in use, being within said housing adjacent said third wall to prevent rotation of said second member out of said housing.

3. The apparatus of claim 2 wherein, in use, said fifth plate abuts a portion of said third wall when said second member is rotated about said shackle, to prevent, in combination with said eighth plate, rotation of said second member out of said housing.

* * * * *